United States Patent [19]

Yoshimoto et al.

[11] Patent Number: 4,689,795
[45] Date of Patent: Aug. 25, 1987

[54] SEMICONDUCTOR LASER CONTROLLER

[75] Inventors: Kyosuke Yoshimoto; Osamu Ito, both of Hyogo, Japan

[73] Assignee: Mitsubishi Denki Kabushiki Kaisha, Tokyo, Japan

[21] Appl. No.: 727,447

[22] Filed: Apr. 26, 1985

[30] Foreign Application Priority Data

Apr. 27, 1984 [JP] Japan ................................ 59-85517
Jan. 11, 1985 [JP] Japan ................................ 60-3877

[51] Int. Cl.$^4$ .............................................. H01S 3/13
[52] U.S. Cl. ........................................ 372/31; 372/38; 372/26
[58] Field of Search ................ 372/38, 29, 31; 378/26

[56] References Cited

U.S. PATENT DOCUMENTS 4,611,352  9/1986  Fujito ..................................... 372/31

FOREIGN PATENT DOCUMENTS 1563944  4/1980  United Kingdom .

Primary Examiner—Leon Scott, Jr.
Attorney, Agent, or Firm—Bernard, Rothwell & Brown

[57] ABSTRACT

A semiconductor laser controller comprising an optical detecting circuit for detecting the output of a semiconductor laser, a first circuit for controlling the semiconductor laser driving current on the basis of a bottom output of the semiconductor laser detected by the optical detecting circuit, a detecting and holding circuit which detects the peak output at the start of the pulse modulation of the semiconductor laser and holds the peak output, and a second means for the feed-forward control of the modulated pulse amplitude of the semiconductor laser after the start of the pulse modulation, whereby the semiconductor laser controller is capable of restricting the change of the peak output of a semiconductor laser resulting from the variation of the quantization efficiency with temperature and passage of time, and stabilizing the peak output within a short time.

8 Claims, 20 Drawing Figures

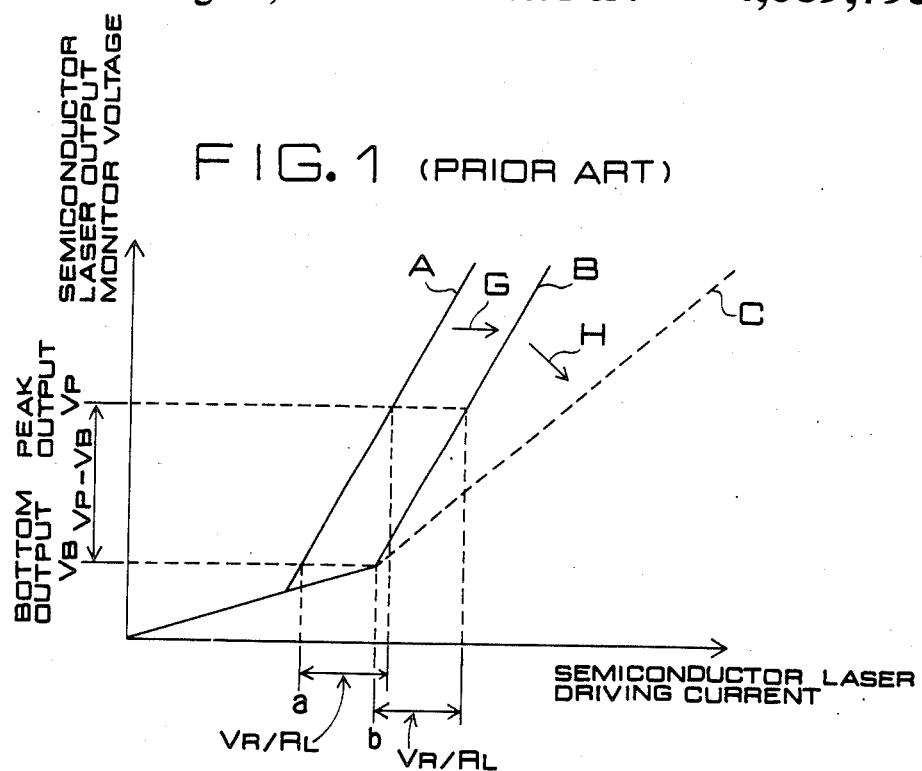
FIG. 1 (PRIOR ART)
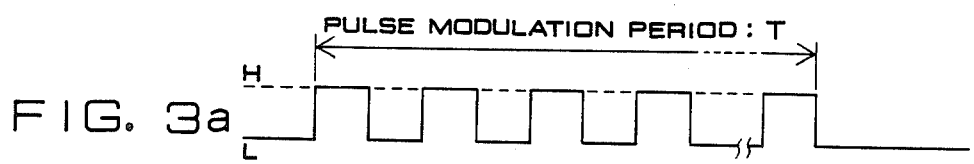
FIG. 3a
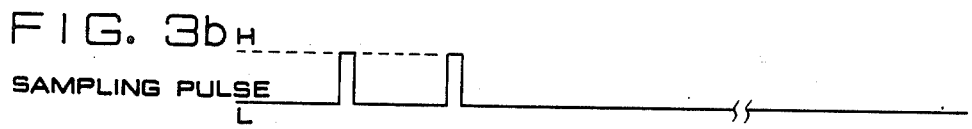
FIG. 3b SAMPLING PULSE
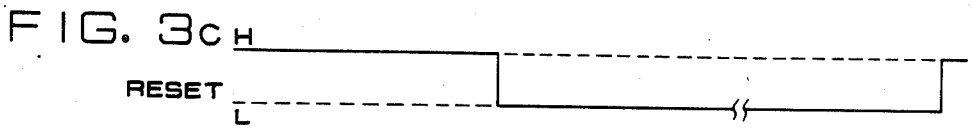
FIG. 3c RESET
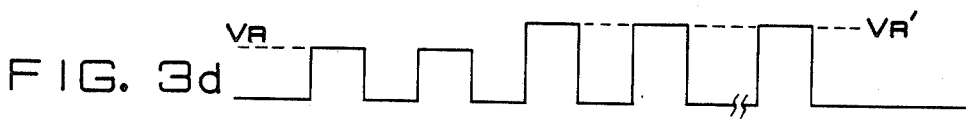
FIG. 3d

SEMICONDUCTOR LASER CONTROLLER

BACKGROUND OF THE INVENTION

1. Field of the Invention

The present invention relates to a semiconductor laser controller.

2. Description of the Prior Art

Semiconductor laser controllers have been proposed for use in an optical disk apparatus of an addition record type which records data by directly modulating a semiconductor laser by recording signals and forming holes in a rotating disk-shaped recording medium.

A typical semiconductor laser controller has been disclosed in Japanese Patent Application No. 57-34903 of the applicant of the present application. In this conventional semiconductor controller, the output of a semiconductor laser is monitored continuously with an optical detector accommodated together with the semiconductor laser in a package, the output of the semiconductor laser is sampled directly when pulse modulation is not executed or the bottom output monitor voltage is sampled when pulse modulation is executed, by means of a peak detection circuit or a sample hold circuit, and the output or the bottom output monitor voltage is compared with a reference voltage ($V_B$) corresponding to a predetermined bottom output for the feedback control of the semiconductor laser driving current.

A semiconductor laser controller of such a construction, however, has a problem that since only the bottom output is controlled when pulse modulation is executed, the peak output changes under the influence of the change of the characteristics of the semiconductor laser with temperature and passage of time. A semiconductor laser is subject to great variation with temperature and passage of time in respect of oscillation threshold value and quantizing efficiency. An object of the above-mentioned semiconductor laser controller is to restrict the output variation of a semiconductor laser resulting from the change of the oscillation threshold value with temperature and passage of time to the least extent. FIG. 1 is a graphical representation of laser output characteristics, for assistance, in explaining the functions of a conventional semiconductor laser controller, in which the relation of semiconductor laser driving current to semiconductor laser output characteristics is shown. In FIG. 1, an arrow G indicates the change of the output characteristics of a semiconductor laser from a curve A to a curve B due to the change of the oscillation threshold. An arrow H indicates the output characteristics of the same from a curve B to a curve C indicated by broken line due to the change of the quantization efficiency. In FIG. 1, $V_B$ is bottom output monitor voltage, $V_p$ is peak output monitor voltage when pulse modulation is executed, $V_R$ is modulated pulse voltage amplitude, and $R_L$ is the load resistance of a semiconductor laser.

Accordingly, modulated pulse current amplitude $I_R = V_R/R_L$.

The above-mentioned semiconductor laser controller stabilizes the bottom output by shifting the semiconductor laser driving current from a to b, when the output characteristics of the semiconductor laser changes from the curve A to the curve B, and also achieves indirectly the stabilization of the peak output by a fact that the variation of the peak output is limited to the least extent if the modulated pulse voltage amplitude $V_R$ is fixed, provided that the quantization efficiency remains unchanged.

However, if the quantization efficiency changes, the peak output changes accordingly.

If the peak output of the semiconductor laser is controlled through a feedback control system, every start of pulse modulation requires drawing action and the setting time is too long to be neglected as compared with the period of pulse modulation. An attempt to reduce the setting time causes wide variation of the peak output at the start of modulation, which causes problems, such as unsatisfactory recording and reproduction, when the semiconductor laser is applied to an apparatus, such as an optical disk apparatus, and hence the reduction of the setting time has been infeasible.

SUMMARY OF THE INVENTION

Accordingly, it is an object of the present invention to provide a semiconductor laser controller capable of restricting the change of the peak output of a semiconductor laser resulting from the variation of the quantization efficiency with temperature and passage of time, and stabilizing the peak output within a short time.

The object of the present invention is achieved by a semiconductor laser controller comprising: (a) an optical detecting means for detecting the output of a semiconductor laser; (b) a first means for controlling the semiconductor laser driving current on the basis of a bottom output of the semiconductor laser detected by the optical detecting means; (c) a first detecting and holding circuit which detects the peak output at the start of the pulse modulation of the semiconductor laser and holds the peak output; and (d) a second means for the feed-forward control of the modulated pulse amplitude of the semiconductor laser after the start of the pulse modulation.

BRIEF DESCRIPTION OF THE DRAWINGS

FIG. 1 is a graph showing laser output characteristics for assistance in explaining the functions of a conventional semiconductor laser controller;

FIGS. 3a–3d and 4 are waveform charts and a graph of laser output characteristics, respectively, for assistance in explaining the functions of the embodiment of the present invention;

DESCRIPTION OF THE PREFERRED EMBODIMENTS

Figure 2:
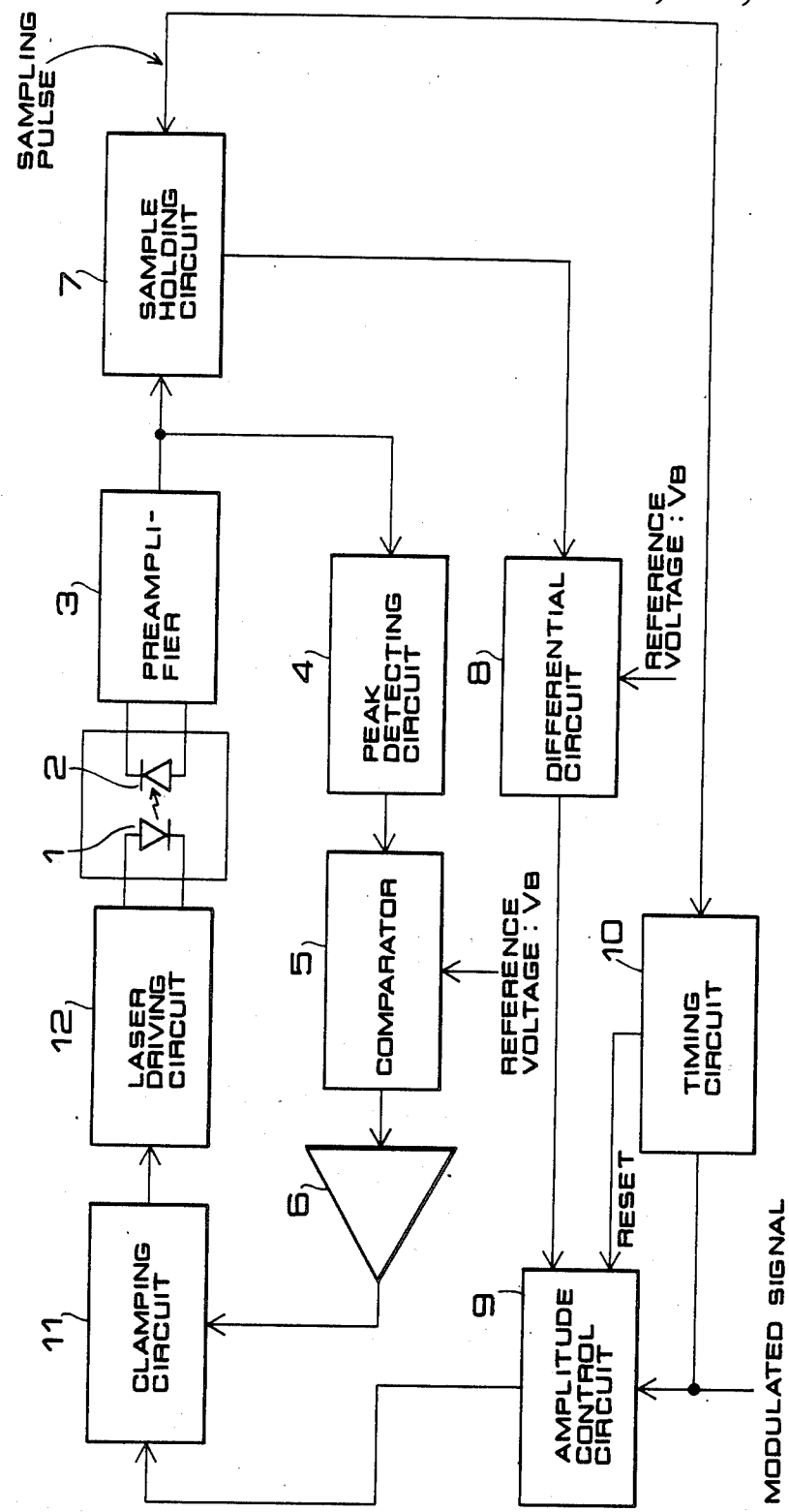
FIG. 2 is a block diagram of a semiconductor laser controller, in a preferred embodiment, according to the present invention.

A semiconductor laser controller embodying the present invention is shown in FIG. 2. In FIG. 2, there are shown a semiconductor laser 1, an optical detector 2, such as a phototransistor packed together with the semiconductor laser 1 in a package, and a preamplifier 3 for converting the output of the optical detector into a predetermined voltage level. The optical detector 2 and the preamplifier 3 constitute an optical detecting means for detecting the output of the semiconductor laser 1. Also shown in FIG. 2 are: a peak detecting circuit 4 for detecting the peak and bottom output of the preamplifier 3, a comparator 5 which compares the output of the peak detecting circuit 5 with a predetermined bottom output reference voltage $V_B$, an amplifier 6 for amplifying the output signal of the comparator 5, a sample holding circuit 7 for sampling and holding the peak output signals of the preamplifier 3 when the semiconductor laser 1 is pulse-modulated, for example, the peak output signals corresponding to the initial two pulses at the start of the pulse modulation, a differential circuit 8 for subtracting the predetermined bottom output reference voltage $V_B$ from the output signal of the sample holding circuit 7, an amplitude control circuit for varying the pulse amplitude after the start of the pulse modulation, according to the sampled and held output signals, a timing circuit 10 which detects the start of the pulse modulation, generates a sampling pulse for sampling the peak output signals, for example, corresponding to two pulses only at the start of the pulse modulation, and resets the amplitude control circuit 9 during the sampling, a clamping circuit 11 for superposing the modulated pulse on a bottom output control bias, and a semiconductor laser driving circuit 12 for driving the semiconductor laser 1. The circuits 4, 5, 6, 11 and 12 constitute the first means for controlling the semiconductor driving current on the basis of the results of detection of the bottom output of the semiconductor laser 1, the circuits 7 and 10 constitute a detecting and holding circuit for detecting and holding the peak output signals at the start of the pulse modulation, and the circuits 8, 9, 10, 11 and 12 constitute the second means for the feed-forward control of the pulse amplitude of the semiconductor laser according to the output signal of the detecting and holding circuit after the start of the pulse modulation.

The functions of this embodiment will be described hereinafter in connection with FIGS. 3 and 4.

The output of the semiconductor laser 1 is monitored continuously by the optical detector 2, and then the output is converted into a voltage of a predetermined level by the preamplifier 3. The output of the preamplifier 3 corresponding to the bottom output of the semiconductor laser is monitored for peak detection by the peak detecting circuit 4. The comparator 5 compares the monitored output of the preamplifier 3 with a reference voltage $V_B$ corresponding to the reference bottom output. The amplifier 6 amplifies the difference between the output of the preamplifier 3 and the reference voltage $V_B$ for the negative feedback of the amplified output of the amplifier 6 through the clamping circuit 11 to the semiconductor laser driving circuit 12. Thus, the semiconductor laser bottom output monitoring voltage is maintained always at the reference bottom output $V_B$, and thereby the bottom output of the semiconductor laser 1 is adjusted to the predetermined bottom output level. When modulation is not performed, the bottom output of the semiconductor 1 is maintained at a regenerative output corresponding to the reference bottom output $V_B$. At this time, the clamping circuit 11 is not concerned with this loop. These functions are the same as those of the conventional semiconductor laser controller. According to the present invention, in addition to the above-mentioned functions, the peak output of the preamplifier 3 while the semiconductor laser 1 is pulse-modulated for a period corresponding, for example, to a pulse modulation period T of FIG. 3a is sampled and held by the sample holding circuit 7 only at the start of the pulse modulation, for example, the output signals corresponding to the initial two pulses, and then the amplitude control circuit 9 changes the modulated pulse amplitude according to the remainder of the subtraction of the bottom output reference voltage $V_B$ from the samples held by the sample holding circuit 7. During the variation of the modulated pulse amplitude, the amplitude control circuit 9 is reset for a period corresponding to a predetermined number of pulses, for example, two pulses, by a reset signal as shown in FIG. 3c by detecting the start of the pulse modulation and sampling pulses as shown in FIG. 3b for sampling the peak output side of the two pulses is generated by the timing circuit 10. The amplitude control circuit 9 is adjusted so as to provide a modulated pulse amplitude $V_R$ as shown in FIG. 3d when reset so that the peak output monitor voltage of the semiconductor laser 1 coincides with a predetermined peak output $V_p$. Thus controlled modulated pulses is superposed on the bottom output control bias, and thereby the modulated pulse amplitude becomes $V_R'$ as shown in FIG. 3d under normal temperature.

Figure 4:
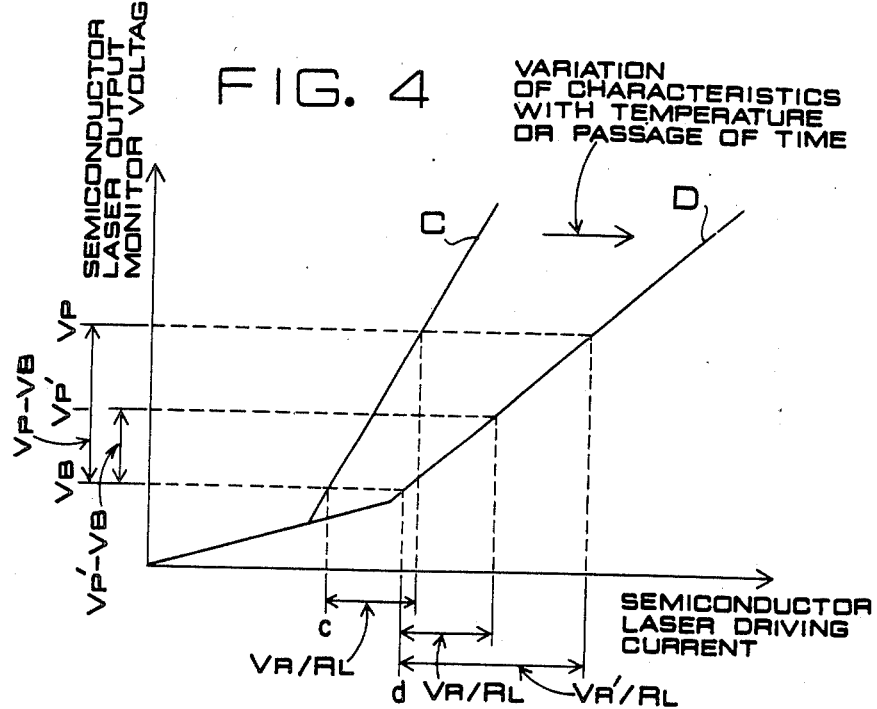

FIG. 4 is a graph of laser output characteristics, for assistance in explaining the function of a semiconductor laser controller embodying the present invention. Suppose that the laser output characteristics of a semiconductor laser under the normal temperature is represented by a curve C showing the relation of semiconductor laser driving current to semiconductor laser output monitor voltage. The peak output voltage of the semiconductor laser is $V_P$ and the peak output of the same coincides with a predetermined peak output at the start of pulse modulation, when the amplitude control circuit is reset, provided that the output characteristics of the semiconductor laser conform to the curve C. When the semiconductor laser output characteristics have varied with temperature and passage of time, from curve C to a curve D, the peak monitor voltage of the semiconductor laser 1 changes to $V_{P'}$, and hence the peak output of the semiconductor decreases to a level below the normal peak output.

Then, the peak monitor voltage $V_{P'}$ of the semiconductor laser under a state where the amplitude control circuit is reset is sampled and held, and the difference $V_{P'}-V_B$, namely, the difference between the peak monitor voltage of the semiconductor laser and the normal bottom reference voltage, is calculated. For example, if the modulated pulse amplitude $V_R'$ is changed from the third pulse thereafter in the manner as expressed by:

$$V_R' = V_R(V_P-V_B)/(V_{P'}-V_B),$$

as apparent from FIG. 3, the peak output monitor voltage $V_P$ of the semiconductor laser 1 is corrected to $V_P$, and thereby the peak output of the semiconductor laser is adjusted to the normal peak output. That is, the amplitude control circuit 9, when reset mode is cancelled as shown in FIG. 3c upon the reception of a voltage $V_{P'}-V_B$, changes the modulated pulse amplitude from $V_R$ to $V_R'$ as shown in FIG. 3d to adjust the peak output of the semiconductor laser to the normal level through feed-forward control.

Thus, since the semiconductor laser controller according to the present invention comprises an optical detecting means for detecting the output of a semiconductor laser, a first means for controlling the semiconductor laser driving current according to the bottom output of the semiconductor laser detected by the optical detecting means, a sampling and holding circuit for sampling and holding the peak output of the semiconductor laser at the start of pulse modulation, and a second means for the feed-forwarad control of the modulated pulse amplitude of the semiconductor laser after the start of pulse modulation according to the output of the sampling and holding circuit, the peak output of the semiconductor laser, when pulse-modulated, can be controlled and stabilized within a short period of time, for example, within a time corresponding to two pulses.

Figure 5:
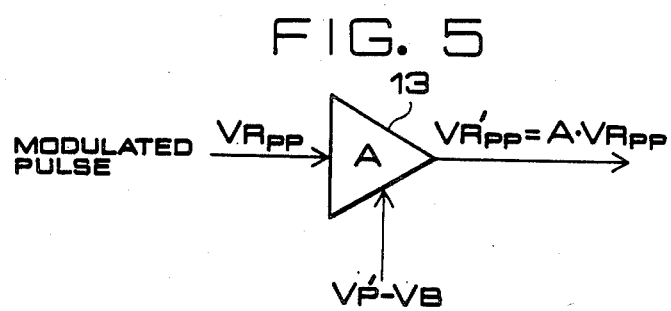
FIGS. 5 and 6 are block diagrams of amplitude control circuits embodying the present invention.
Figure 6:
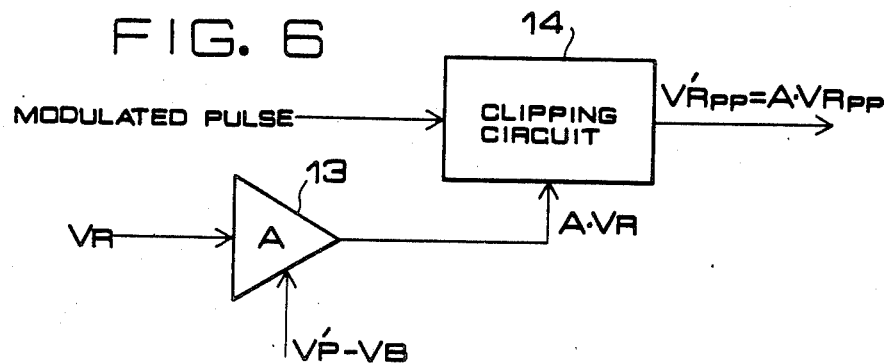

The amplitude control circuit employed in the above-mentioned embodiment may be embodied in a circuit shown in a block diagram in FIG. 5 or 6. In FIG. 5, indicated at 13 is a variable gain amplifier and A is a value expressed by:

$$A = K/(V_P' - V_B), K = V_P - V_B.$$

In this circuit, the modulated pulse is applied directly to the variable gain amplifier 13 and the gain is varied with $V_P - V_B$ (divided by $V_P' - V_B$) to control the modulated pulse. This circuit is simple in constitution, however, it requires a variable gain amplifier having excellent frequency characteristics which will not distort the pulse waveform, which is disadvantageous in respect of cost. FIG. 6 shows an improved circuit, in which indicated at 13 is a variable gain amplifier and at 14 is a clipping circuit. A fixed voltage $V_{REF}$ is applied to the variable gain amplifier 13 and the gain is controlled with $V_P' - V_B$ to obtain a voltage $V_R'$ expressed by:

$$V_R' = A \cdot V_R = (V_P - V_B) \cdot V_R/(V_P' - V_B),$$

and the amplitude of the modulated pulse is clipped by the clipping circuit 14 with this voltage. According to this circuit, since any pulse signal is applied to the variable gain amplifier 13, the variable gain amplifier 13 is required to have frequency characteristics to provide a DC voltage $V_R'$ upon the reception of $V_P' - V_B$ in a period, for example, between the second pulse and the third pulse. Thus the circuit which controls the pulse amplitude directly has an advantage that the circuit is capable of employing an inexpensive clipping circuit of good frequency characteristics. This circuit also has an advantage that an inexpensive variable gain amplifier of high accuracy may be employed according to the moderation of the frequency characteristics.

Although the amplitude control circuit has been described as a circuit which uses two pulses to obtain a sample holding voltage, only a single pulse is sufficient to obtain a sample holding voltage when the sample holding circuit 7 has good frequency characteristics. Furthermore, sample pulses may be generated continuously until the temperature rise resulting from the pulse modulation of the semiconductor laser is stopped and the temperature is stabilized.

Although this embodiment samples and holds the peak output at the start of pulse modulation by means of the sample holding circuit 7 and the timing circuit 10, it is also possible to sample and hold the peak output simply at the start of pulse modulation.

This semiconductor laser controller is applicable to an optical laser card or the like as well as to an optical disk apparatus for highly reliable performance.

Figure 7:
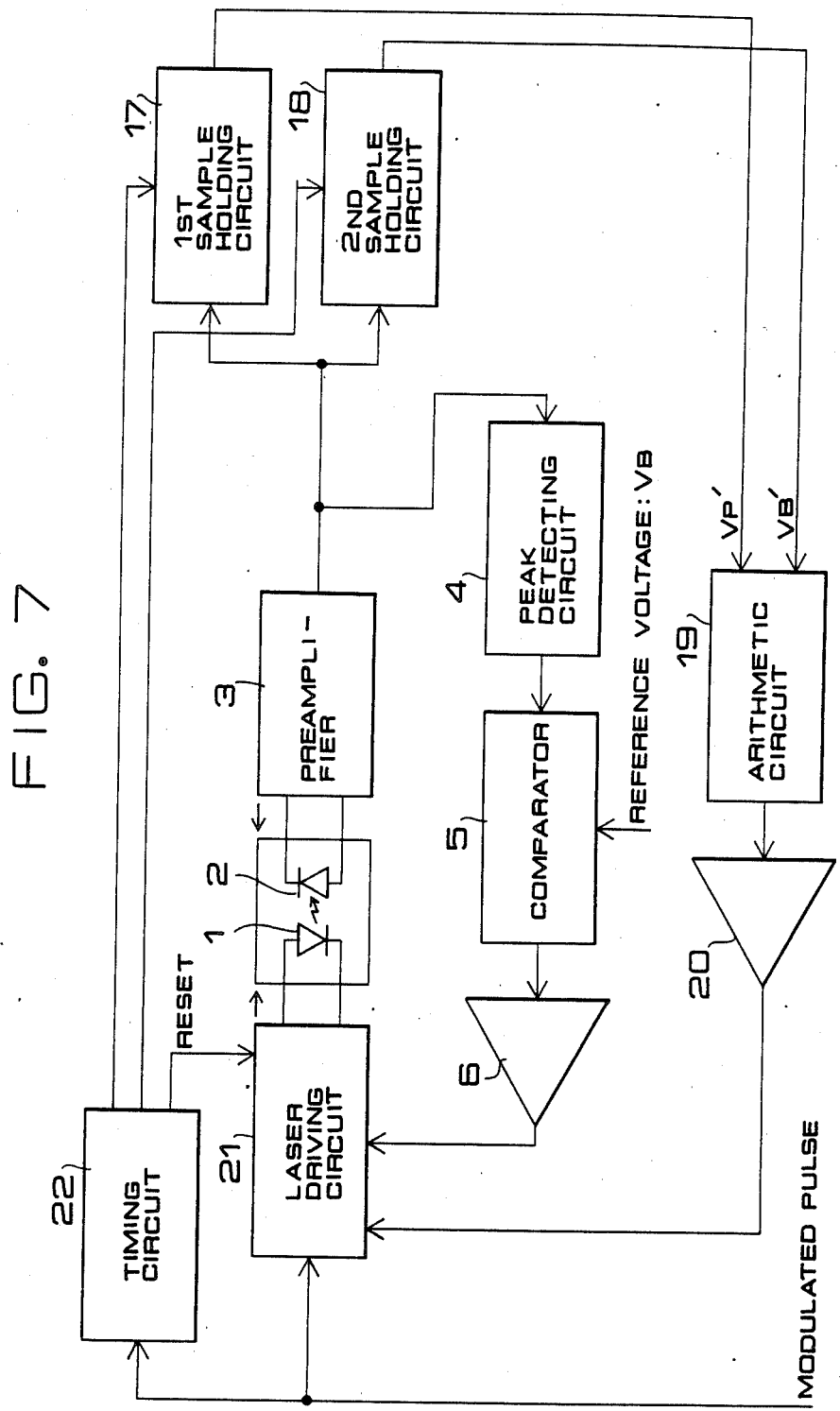
FIG. 7 is a block diagram of a semiconductor laser controller, in another embodiment, according to the present invention.

FIG. 7 shows another embodiment of the present invention. In FIGS. 1 and 7, like reference characters designate like or corresponding parts. Part of the constitution and the functions of this embodiment which are different from those of the first embodiment will be described. In FIG. 7, there are shown a first sample holding circuit 17 for sampling and holding the peak output side of the output of a preamplifier 3 when a semiconductor laser 1 is pulse-modulated, for a period corresponding, for example, to two pulses generated immediately after the start of pulse modulation, a second sampling and holding circuit 18 for sampling and holding the bottom output of the preamplifier 3 when the semiconductor laser 1 is pulse-modulated, for a period corresponding, for example, to two pulses generated immediately after the start of pulse modulation, an arithmetic circuit 19 for calculating the modulated pulse amplitude after the start of pulse modulation on the basis of the output $V_P'$ of the first sample holding circuit 17 and the output $V_B'$ of the second sample holding circuit 18, an amplifier 20 for amplifying the output of the arithmetic circuit 19, a semiconductor laser driving circuit 21 for continuously controlling the current for driving the bottom output of the semiconductor laser according to the output of an amplifier 6 and for superposing a fixed modulated pulse current at the start of pulse modulation and a modulated pulse current according to the output of the amplifier 20 after the start of pulse modulation on the bottom output driving current, and a timing circuit 22 for detecting the start of pulse modulation, generating sampling pulses for sampling, for example, two pulses, only at the start of pulse modulation and notice the semiconductor laser driving circuit 21 of the sampling period. The circuits 4, 5, 6 and 21 constitute a first means to control the current for driving the semiconductor laser 1 by detecting the bottom output of the semiconductor laser 1. The circuits 17 and 22 constitute a first detecting and holding circuit for detecting the peak output of the semiconductor laser 1 when pulse-modulated at the start of pulse modulation and holding the detected peak output. The circuits 18 and 22 constitute a second detecting and holding circuit for detecting and holding the bottom output of the semiconductor laser when pulse-modulated. The circuits 19, 20, 21 and 22 constitute a second means for the feed-forward control of the modulated pulse current amplitude of the semiconductor laser after the start of pulse modulation, according to the outputs of the first and the second detecting and holding circuits.

The functions of the semiconductor laser controller will be described hereinafter in connection with the drawings.

Referring to FIG. 7, the output of the semiconductor laser 1 is monitored continuously by the optical detector 2 and is converted into a voltage of a predetermined level by the preamplifier 3. The output voltage of the preamplifier 3 corresponding to the bottom output side of the semiconductor laser is monitored continuously for peak detection by the peak detecting circuit 4, and is compared with a reference voltage $V_B$ corresponding to the normal bottom output by the comparator 5. The difference between the output voltage of the preamplifier 3 and the reference voltage $V_B$ is amplified by the amplifier 6 and the amplified value is applied to the semiconductor laser driving circuit 21 for negative feedback. Thus the voltage of the monitored bottom output of the semiconductor laser 1 is maintained continuously at the reference bottom output $V_B$, so that the semiconductor laser 1 provides the normal bottom output. When not pulse-modulated, the bottom output is maintained at a regenerative output corresponding to the reference bottom output.

These functions are the same as those of the conventional semiconductor laser controller. This embodiment has, in addition to the above-mentioned functions, a function to sample and hold the peak output side and the bottom output side of the output voltage of the preamplifier 3 when the semiconductor laser 1 is pulse-modulated, at the start of pulse modulation for a period, for example, corresponding to the initial two pulses, by the first and second sample holding circuits 17 and 18 and, thereafter, to vary the modulated current amplitude according to the values held by the first and second sample holding circuits 17 and 18. The timing circuit 22 detects the start of pulse modulation for a modulation signal of a period T as shown in FIG. 8a, sends a reset signal as shown in FIG. 8d to the semiconductor laser driving circuit 21 for the duration of a predetermined number of pulses, for example, two pulses, and generates sampling pulses as shown in FIG. 8b for sampling the peak output side of two pulses and sampling pulses as shown in FIG. 8c for sampling the bottom output side of the two pulses.

The semiconductor laser driving circuit 21 is supposed to be adjusted so that, upon the reception of the reset signal from the timing circuit 22, a modulated pulse current $I_R = V_R/R_L$ which makes the peak output monitor voltage of the semiconductor laser 1 coincide with the normal peak output monitor voltage $V_P$ in the normal temperature adjusting mode is superposed on the bottom output driving current.

Figure 9:
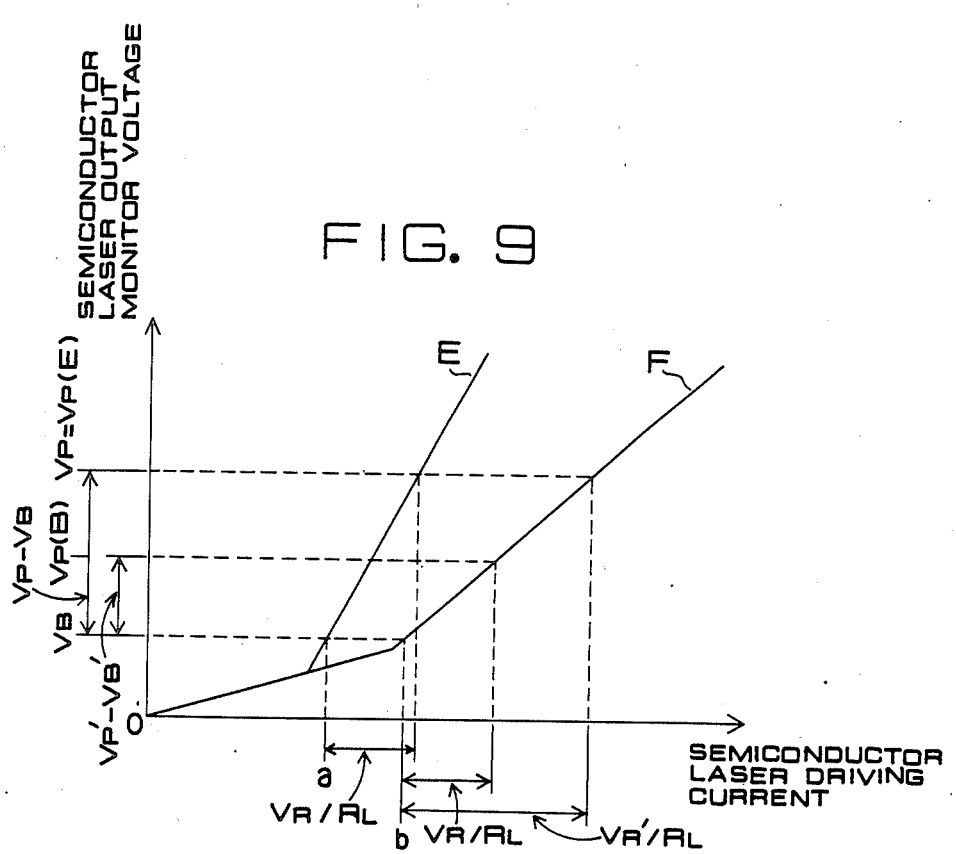

FIG. 9 shows a diagram showing laser output characteristics, for assistance in explaining the functions of the embodiment of the present invention.

Figure 8:
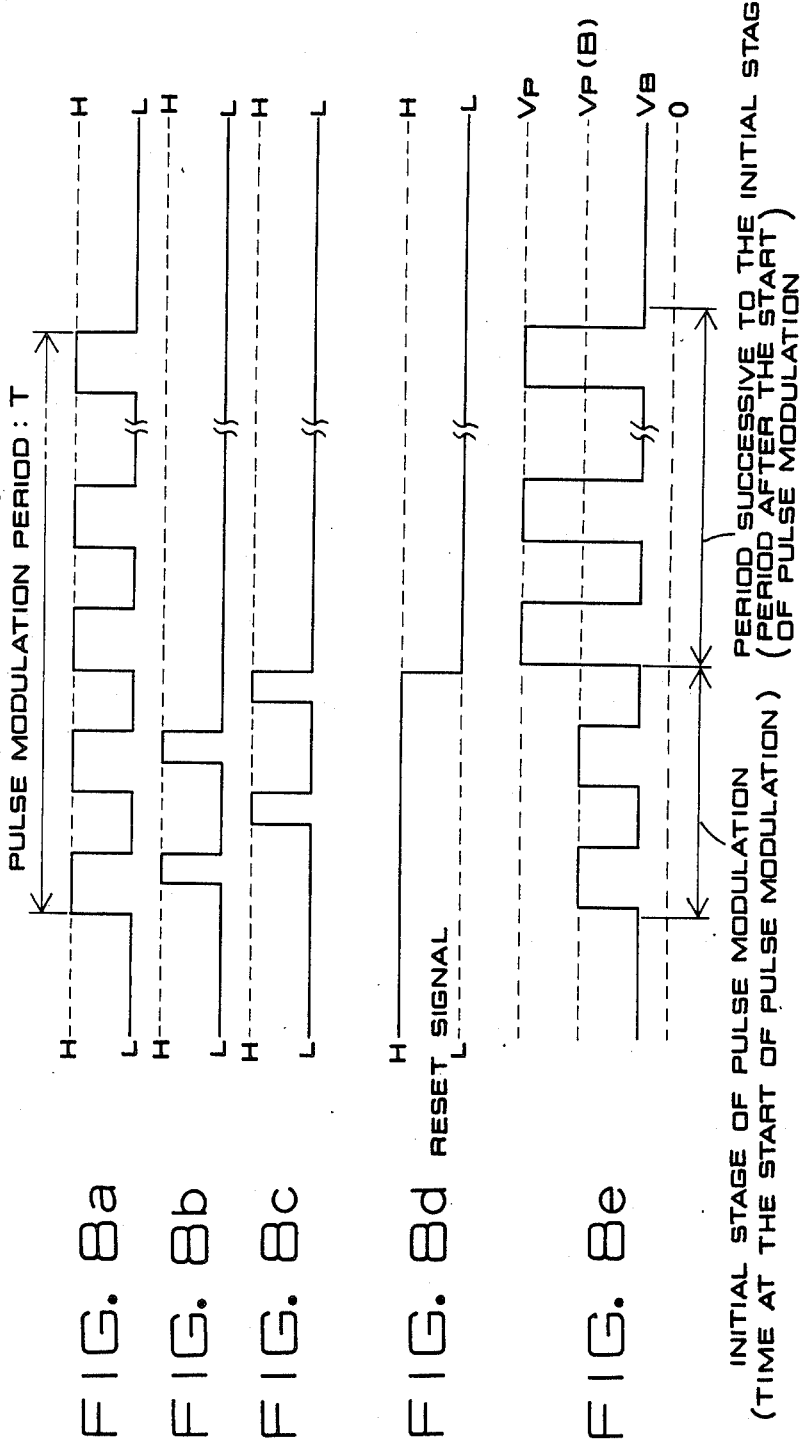
FIGS. 8a–8e and 9 are waveform charts and a graph showing the laser output characteristics, respectively, of the embodiment of the present invention.

The manner of controlling the peak output of a semiconductor laser through the use of the semiconductor laser controller of the above-mentioned constitution will be described hereinafter in connection with FIGS. 7, 8 and 9.

Referring first to FIG. 9, suppose that the output characteristics of the semiconductor laser adjusted to the normal temperature condition is represented by a curve E showing the variation of the semiconductor laser output monitor voltage with semiconductor laser driving current. As long as the variation of the output of the semiconductor laser with the semiconductor laser driving current conforms to the curve E, the peak output monitor voltage $V_P(E)$ at the start of pulse modulation is $V_P$, and hence the semiconductor laser 1 provides the normal peak output. If the output characteristics of the semiconductor laser 1 changes with temperature or passage of time, from the curve E to a curve F, the peak output monitor voltage of the semiconductor laser 1 at the start of pulse modulation changes to $V_P(F)$, and thereby the peak output of the semiconductor laser 1 decreases to a value below the normal peak output.

To maintain the peak output of the semiconductor laser 1 at the normal peak output, a sample peak output monitor voltage $V_P'$ and a sample bottom output monitor voltage $V_B'$ of the semiconductor laser 1 sampled immediately after the start of pulse modulation are compared to obtain the difference $V_P' - V_B'$ and the modulated pulse voltage amplitude is changed to a modulated pulse voltage amplitude $V_R'$ as expressed by:

$$V_R' = V_R(V_P - V_B)/(V_P' - V_B')$$

from the third pusle. Then, as apparent from FIG. 9, the peak output monitor voltage of the semiconductor laser 1 is adjusted to $V_P$, and thereby the peak output of the semiconductor laser 1 coincides with the normal peak output.

The arithmetic circuit 19 shown in FIG. 7 carries out a division:

$$K_1/(V_P' - V_B').$$

Accordingly, the amplification factor $K_2$ of the amplifier 20 needs to be adjusted so that $$K_2 = (V_P = V_B)/K_1.$$

On the other hand, the amplifier 20 applies $V_R'$ to the semiconductor laser driving circuit 21. As shown in FIG. 8d, upon the release of the reset signal, the modulated pulse current amplitude is changed immediately from $V_R/R_L = I_R$ to $V_R'/R_L = I_R'$. Consequently, as shown in FIG. 8e, the peak output monitor voltage of the semiconductor laser 1 changes from $V_P(F)$ to $V_P(E)$ within a far shorter time than the setting time of the drawing action which always accompanies feedback control, and thereby the peak output of the semiconductor laser is adjusted to the normal peak output.

Figure 10:
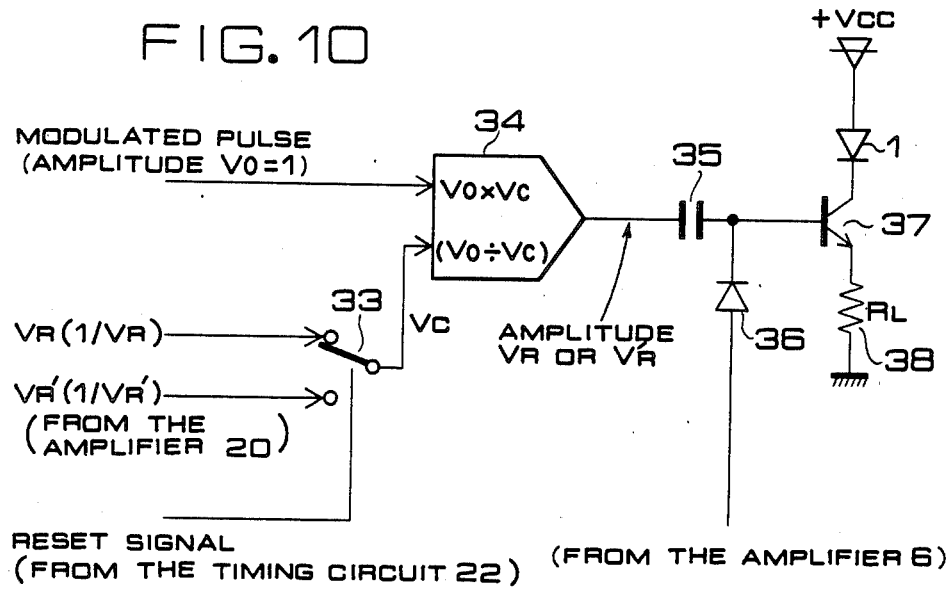
FIGS. 10, 11 and 12 are circuit diagrams of semiconductor laser driving circuits embodying the present invention.
Figure 11:
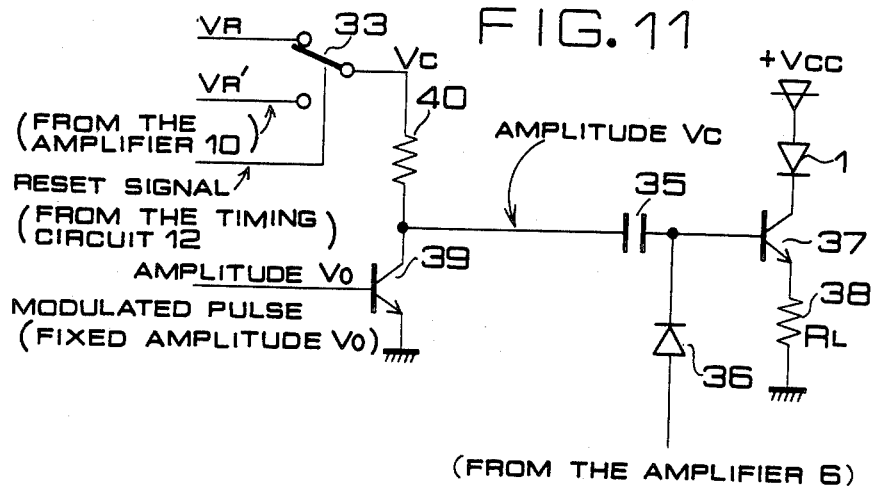
Figure 12:
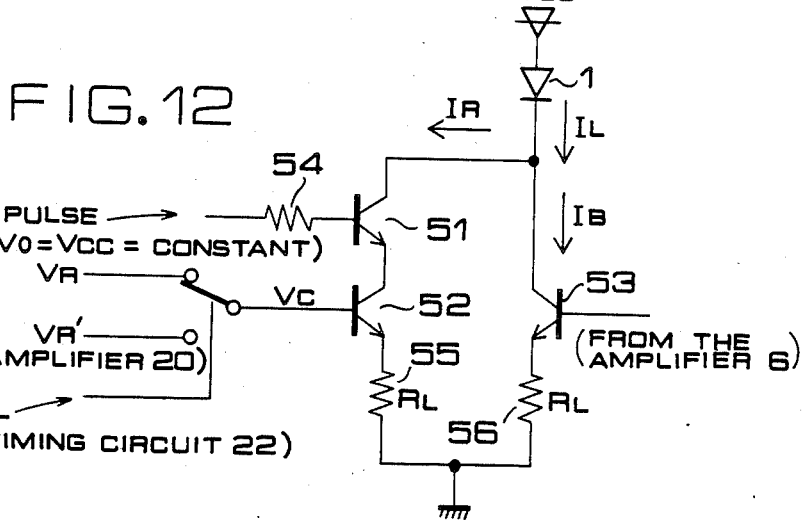

The semiconductor laser driving circuit 21 employed in this embodiment may be embodied in a circuit, for example, as shown in FIG. 10, 11 or 12.

In FIG. 10, indicated at 33 is an analog switch which connects the $V_R$-side or the $V_R'$-side to the circuit when the reset signal is on H-level or on L-level [FIG. 8d] respectively. The analog switch 33 provides an output $V_C$. Indicated at 34 is a multiplier. When a modulated pulse of an amplitude $V_0 = 1$ is applied to the multiplier 34, the same provides a modulated pulse of an amplitude $V_C$. In this circuit, the multiplier 34 may be substituted by a divider to make the arithmetic circuit 19 execute subtraction instead of multiplication. When a divider is employed, the arithmetic circuit 19 is supposed to execute a subtraction, $V_A' = V_P' - V_B'$ and $1/V_R$ instead of $V_R$ or $1/V_R'$ instead of $V_R'$ is applied to the analog switch 33. Accordingly, the amplification factor $K_2$ of the amplifier 20 needs to be adjusted to $1/V_R(V_P - V_B)$. In this state, the amplifier 20 applies $1/V_R'$ to the semiconductor laser driving circuit 21.

In these conditions, the modulated pulse is applied directly to the multiplier 34 or the divider 34 and multiplied or divided by $V_C$ to control the modulated pulse voltage amplitude. This configuration is simple in construction, however, it requires a multiplier or a divider having good frequency characteristics which will not distort the pulse waveform and has problems in respect of accuracy and cost.

The modulated pulse of the amplitude $V_R$ or $V_R'$ controlled by the multiplier 34 or the divider 34 is superposed on the voltage for driving the bottom output of the semiconductor laser 1 by a clamping circuit consisting of a capacitor 35 and a diode 36. The mixed semiconductor laser driving voltage is applied to the base of a semiconductor laser driving transistor 37 so that a semiconductor laser driving current is supplied to the load resistance 38 of the semiconductor laser 1 to drive the semiconductor laser.

Referring to FIG. 11 showing another embodiment of the semiconductor laser driving circuit, indicated at 39 and 40 are transistor and a resistance, respectively. The transistor 39 and the resistance 40 constitute a switching circuit for switching between ground and $T_C$ in accordance with the modulated pulse. Consequently, the amplitude of the modulated pulse is converted from $V_0$ to $T_C$. Then, the semiconductor laser 1 is controlled in the same manner as that explained with reference to FIG. 4. This embodiment needs neither the multiplier 34 nor the divider 34, however, the arithmetic circuit 19 is required to complete a division: $K_1/(V_P'-V_B')$ before the reset signal is released, in this case, before the reset signal is changed from H-level to L-level. This division is a so-called DC operation and does not deal directly with the modulated pulse, therefore, the frequency characteristics which will not distort the pulse waveform are not essential, and hence an inexpensive and highly accurate circuit can be used. It is possible to use a monolithic IC.

Referring to FIG. 12 showing further embodiment of the semiconductor laser driving circuit, there are shown transistors 51, 52 and 53, and resistances 54, 55 and 56. The collector and the emitter of the transistor 51 are switched on or switched off according to the modulated pulse. While the transistor 51 is switched off, a current $I_L$ $I_B$ flows through the semiconductor laser 1, and thereby the semiconductor laser 1 is driven only by the bottom output driving current, and hence the normal bottom output of the semiconductor laser 1 is maintained. While the transistor 51 is switched on, the current $I_L$ that flows through the semiconductor laser 1 changes to $$I_L = I_B + I_R = I_B + V_C/R_L,$$

therefore, the semiconductor laser is driven by a current corresponding to the addition of the bottom output driving current and the modulated pulse current to maintain the output of the semiconductor laser at the normal peak output. The voltage $V_{BE}$ between the base and the emitter of the transistor 52 is neglected, however, the actual voltage is $V_C + V_{BE}$.

Figure 13:
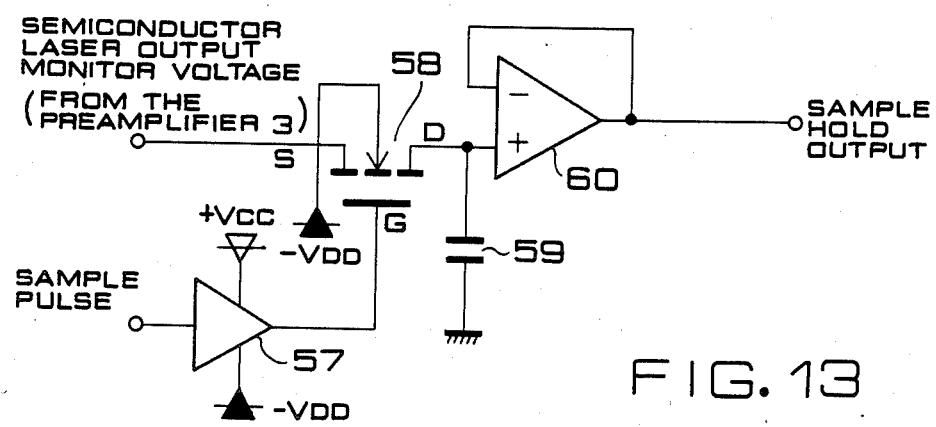
FIG. 13 is a circuit diagram of a sample hold circuit embodying the present invention.

A sample holding circuit shown in FIG. 13 may be employed as the first and second sample holding circuits 17 and 18 of the embodiment. In FIG. 13, there are shown a voltage level converter 57, a field effect transistor 58, a holding capacitor 59, and an operational amplifier 60 of the FET input type. Sample pulses of TTL level are converted into a $+V_{CC}$ level and $-V_{DD}$ level by the voltage level converter 57, and then applied to the gate G of the field effect transistor 58. While the gate voltage is $+V_{CC}$, a source input voltage below $+V_{CC}-V_{th}$ is connected. While the gate voltage is $-V_{DD}$, a source input voltage above $-V_{DD}$ is disconnected. $V_{th}$ indicates a voltage necessary to connect the source S and the gate G of the field effect transistor. The respective levels of $+V_{CC}$ and $-V_{DD}$ are determined according to the range of the output monitor voltage of the semiconductor laser, namely, the output of the preamplifier 3 for sampling and holding. When the level of the sampling pulses changes from L-level to H-level as shown in FIG. 8b, the gate voltage of the field effect transistor 58 changes from $-V_{DD}$ to $+V_{CC}$, and thereby the source S and the drain D are connected. Consequently, the output monitor voltage of the semiconductor laser is applied to the holding capacitor 59 and provided through a buffer of the voltage follower type using the operational amplifier 60. When the level of the sampling pulses changes from H-level to L-level, the gate voltage of the field effect transistor 58 changes from $+V_{CC}$ to $-V_{DD}$, and thereby the source S and the drain D are disconnected, and the output monitor voltage of the semiconductor laser immediately before the disconnection is provided through the buffer.

This embodiment employs the peak detecting circuit 4 as the first means for detecting the bottom output of the semiconductor laser to control the driving current, a method employing a circuit similar to the sample holding circuits 17 and 18, to hold the bottom output monitor voltage of the semiconductor laser immediately before the start of pulse modulation, during pulse modulation, or a method for sample and hold the bottom output side of the semiconductor laser continuously also during pulse modulation may be employed. These methods may additionally employ the second sample holding circuit 18. In such a case, the sampling pulses provided by the second sample holding circuit 18 are sent out through the timing circuit 22 at a timing for sampling the bottom output, immediately before the start of pulse modulation or over the entire period of pulse modulation. While pulse modulation is not performed, the level of the sampling pulse must be H-level.

Furthermore, this embodiment employs the second sample holding circuit 18 for sampling and holding the pulse modulated bottom output of the semiconductor laser immediately after the start of pulse modulation and the timing circuit 22 as the second detecting and holding circuit, however, the sample holding circuit 18 and the timing circuit 22 may be constituted so that the bottom output side is sampled and held, not only immediately after the start of pulse modulation, but also immediately before the start of pulse modulation or over the entire bottom period of pulse modulation.

In the explanation made hereinbefore, the embodiment is considered to obtain the sample holding voltage on the basis of the initial two pulses at the start of pulse modulation, however, one pulse is enough to obtain the sample holding voltage, provided that the sample holding circuits 17 and 18 have good characteristics and temperature variation at the junction resulting from the pulse modulation of the semiconductor is stabilized within one pulse, or more than two pulses within an appropriate range relative to the pulse modulation period may be used.

This embodiment employs the first and second sample holding circuits 17 and 18 which sample and hold the peak output and the bottom output of the pulse modulated semiconductor laser immediately after the start of pulse modulation and the timing circuit 22 as the first detecting and holding circuit for detecting and holding the peak output of the pulse-modulated semiconductor laser immediately after the start of pulse modulation and the second detecting and holding circuit for detecting the bottom output of the pulse-modulated semiconductor laser immediately after the start of pulse modulation and holding the detected bottom output for the rest of the period of pulse modulation, however, a peak detecting circuit for detecting the peak output of the pulse-modulated semiconductor laser immediately after the start of pulse modulation and a peak detecting circuit for detecting the bottom output immediately before the start of pulse modulation, immediately after pulse modulation or during the bottom period in the period of pulse modulation may be employed.

Obviously many modifications and variations of the present invention are possible in the light of the above teachings, and hence the present invention is not limited to those embodiments disclosed herein. It is therefore to be understood that within the scope of the appended claims in the invention may be practiced otherwise than as specifically described.

What is claimed is:

1. A semiconductor laser controller comprising: (a) an optical detecting means for detecting the output of a semiconductor laser which output varies between a peak output and a bottom output; (b) a first means for controlling the semiconductor laser driving current on the basis of a bottom output of the semiconductor laser detected by the optical detecting means; (c) a first detecting and holding circuit which detects the peak output at the start of pulse modulation of the semiconductor laser and holds the peak output; and (d) a second means for feed-forward control of a modulated pulse amplitude of the semiconductor laser after the start of the pulse modulation.

2. A semiconductor laser controller according to claim 1, wherein a second detecting and holding circuit for detecting and holding the bottom output of the pulse-modulated semiconductor laser is provided additionally, and said second means includes means to carry out feed-forward control of the modulated pulse amplitude of the semiconductor laser after the start of pulse modulation, and means responsive to the output of the second detecting and holding circuit and the output of the first detecting and holding circuit.

3. A semiconductor laser controller according to claim 2, wherein the pulse modulation is provided over a predetermined period, and said second detecting and holding circuit includes means to detect the bottom output immediately after the start of the pulse modulation and to hold the bottom output during the remainder of the period of pulse modulation, selectively movable to a first position or a second position.

4. A semiconductor laser controller according to claim 1, wherein said second means comprises a differential circuit which subtracts a reference bottom output from the output of the detecting and holding circuit, and an amplitude control circuit which controls the modulated pulse amplitude on the basis of the output of the differential circuit after the start of pulse modulation, said amplitude control circuit being connected to said first means for providing an output thereto.

5. A semiconductor laser controller according to claim 4, wherein said amplitude control circuit is a variable gain amplifier, modulated pulses are applied directly to the input terminal of the variable gain amplifier, and the modulated pulse amplitude is controlled on the basis of the output of the differential circuit.

6. A semiconductor laser controller according to 4, wherein said amplitude control circuit consists of a variable gain amplifier and a clamping circuit, a fixed voltage is applied to the input terminal of the variable gain amplifier, the gain of the variable gain amplifier is controlled on the basis of the output of the differential circuit, the output of the amplitude control circuit is given to the clamping circuit, and the amplitude of the modulated pulse is controlled on the basis of the output of the variable gain amplifier.

7. A semiconductor laser controller according to claim 1, wherein said first detecting and holding circuit uses a plurality of pulses for obtaining a sample holding voltage.

8. A semiconductor laser controller according to claim 1, wherein said second means has an arithmetic circuit which receives the respective outputs of the first and second detecting and holding circuits and calculates the modulated pulse amplitude after the start of pulse modulation, and the first means controls the supply of the driving current, namely, the modulated pulse current, according to the output of the arithmetic circuit.

* * * * *

UNITED STATES PATENT AND TRADEMARK OFFICE
CERTIFICATE OF CORRECTION

PATENT NO. : 4,689,795
DATED : August 25, 1987
INVENTOR(S) : Kyosuke Yoshimoto and Osamu Ito It is certified that error appears in the above-identified patent and that said Letters Patent is hereby corrected as shown below:

Column 7, line 66, "pusle" should be --pulse--.

Column 8, line 64, "$T_C$" should be --$V_C$--;

line 67, "$T_C$" should be --$V_C$--.

Signed and Sealed this

Nineteenth Day of January, 1988

Attest:

DONALD J. QUIGG

*Attesting Officer*    *Commissioner of Patents and Trademarks*